United States Patent [19]

Boos

[11] Patent Number: 5,196,358
[45] Date of Patent: Mar. 23, 1993

[54] METHOD OF MANUFACTURING INP JUNCTION FETS AND JUNCTION HEMTS USING DUAL IMPLANTATION AND DOUBLE NITRIDE LAYERS

[75] Inventor: John B. Boos, Springfield, Va.

[73] Assignee: The United States of America as represented by the Secretary of the Navy, Washington, D.C.

[21] Appl. No.: 459,155

[22] Filed: Dec. 29, 1989

[51] Int. Cl.$^5$ ........................................ H01L 21/334
[52] U.S. Cl. ........................................ 437/40; 437/39; 437/133; 437/911; 437/978; 748/DIG. 43; 748/DIG. 84; 748/DIG. 88
[58] Field of Search ................. 437/40, 41, 39, 59, 437/203, 133, 107, 106, 978, 912, 911, 176; 357/16, 22; 748/DIG. 43, DIG. 84, DIG. 88, DIG. 114

[56] References Cited

U.S. PATENT DOCUMENTS

| H291 | 6/1987 | Boos | 156/643 |
|---|---|---|---|
| 4,196,439 | 4/1980 | Niehans | 357/22 |
| 4,325,073 | 4/1982 | Hughes et al. | 357/22 |
| 4,727,404 | 2/1988 | Boccon-Gibod | 357/22 |
| 4,816,881 | 3/1989 | Boos et al. | 357/22 |
| 4,830,980 | 5/1989 | Hsien | 437/56 |

FOREIGN PATENT DOCUMENTS 56-48177  5/1981  Japan .

OTHER PUBLICATIONS

Boos et al., "Planar, Fully Ion-Implanted InP Junction FET's with a Nitride-Registered Gate Metallization," IEEE Electron Device Letters, vol. 10, No. 2, Feb. 1989.
Boos, J. B., et al., IEEE Electron Device LEtters, vol. EDL-5, No. 7, Jul. 1984, pp. 273-276.
Alamo, J. A., et al., IEEE Transaction on Electron Devices, vol. 36, No. 4, Apr. 1989, pp. 646-650.

Primary Examiner—Brian E. Hearn
Assistant Examiner—T. N. Quach
Attorney, Agent, or Firm—Thomas E. McDonnell; Edward F. Miles

[57] ABSTRACT

A new planar, fully ion-implanted indium phosphide junction FET (JFET) fabrication process, utilizing n$^+$ source-drain implantation, Be and Be/P p$^+$ gate implantation, and nitride-registered gate metallization.

15 Claims, 5 Drawing Sheets

METHOD OF MANUFACTURING INP JUNCTION FETS AND JUNCTION HEMTS USING DUAL IMPLANTATION AND DOUBLE NITRIDE LAYERS

BACKGROUND OF THE INVENTION

1. Field of the Invention

This invention is directed to a novel process of fabricating indium phosphide junction field-effect transistors (JFETs) and indium phosphide junction high electron mobility transistors (JHEMTs) and more particularly to such processes which utilize a nitride-registered gate approach to obtain JFETs and JHEMTs having sub-micron gate lengths.

2. Background Description

In the past, Indium Phosphide(InP) JFETs have been fabricated using both Zn-diffused and Be ion-implanted approaches. Though respectable gain and power performance has been achieved from devices with 1.5 $\mu$m gate lengths or longer, stringent demands on the fabrication process have impeded the attainment of shorter gate lengths.

The major difference between a JFET and a MESFET is that the gate of a JFET is controlled through the use of a p-n junction whereas in a MESFET a Schottky barrier is employed. Accordingly, two requirements of a JFET which are not present in a MESFET is that a p+ region must be formed and a high quality ohmic contact must be made to this p+ region. This dual requirement complicates the fabrication of JFETs when coupled with the fact that for high frequency performance the length of this p+ region must be one micron or less.

Previous fabrication approaches have employed either vapor-phase epitaxy, blanket or selective diffusion, and blanket or selective ion-implantation to form the p+ region of the JFET. The non-selective approaches incur problems with the removal of the excess p+ material which is not directly beneath the gate metal. This p+ removal process must satisfy a number of different requirements including the use of a highly selective, highly controlled etching procedure which does not adversely affect the p-type metallization, the p-type contact resistance or the JFET transconductance and gate-drain breakdown voltage. A major problem is the necessity that the etch process be of sufficient control to enable stopping at the lower p+/n interface. Compounding the problem is that, instead of obtaining the desired etch front profile, a rounded or spiked profile may occur due to preferential etching near the mask edges. Terminating the etch prior to reaching the interface results in undesirably long gate lengths. Overetching results in transconductance compression since in this case a significant fraction of the gate voltage is used to deplete electrons beneath the channel current, which prior to overetching was constricted by the bottom of the p/n junction, is now constricted by the depletion region formed under the overetched recesses on either side of the gate. Adding to the difficulty of end-point detection is the further complication of the delecterious effects on device performance due to etched surfaces in close proximity to the modulation area.

Designs employing solely a selectively diffused p+ region are limited by the lateral diffusion of the p-type dopant beneath the dielectric mask which hinders the attainment of a 1.0 $\mu$m or less p+ gate length.

Designs employing solely a selectively implanted, 1.0 $\mu$m p+ region are constrained by the requirement of implant registration which must be maintained through the 700°-850° C. activation anneal, and the necessity that the gate metallization be deposited solely within that implanted p-type region. Implanting an initially oversized 2.0-3.0 $\mu$m p+ region relaxes the difficulty of the 1.0 $\mu$m gate metal alignment, but introduces the additional problems associated with the removal of the excess p+ material which was previously mentioned.

SUMMARY OF THE INVENTION

Accordingly, it is a general object of the invention to fabricate JFETs with gate lengths of 1.0 $\mu$m or less.

It is another object of the invention to fabricate JFETs which have a high quality ohmic contact to the gate region.

It is a further object of the invention is to fabricate JFETs wherein the p+ removal does not adversely affect the p-type metallization, the p-type contact resistance or the JFET transconductance and gate-drain breakdown voltage.

Yet another object of the invention is to fabricate JFETs wherein the implant registration is maintained through the activation anneal, and wherein the gate metallization is deposited solely within that implanted p-type region.

These and other objects of the invention are accomplished by a method of fabricating a sub-micron gate semiconductor device which device includes source, drain, gate regions and a channel region connecting the source and drain regions. The fabrication sequence begins by growing a first insulating layer on a semiconductor structure including a substrate and a channel region. Next, source and drain regions are delineated through the first insulating layer and source and drain regions are implanted into a substrate. A second insulating layer is then grown on the first insulating layer. A photoresist layer is then applied and a gate photoresist opening is delineated above the second insulating layer. The first and second insulating layers are then patterned by anisotropic etching to limit the amount of undercutting while using the photoresist layer as a mask.

A first ion selected from a group consisting of P and As, and a second ion selected from the group consisting of Be, Zn, and Cadmium are sequentially implanted through the gate opening into the gate region down to the channel region. The resulting structure with the first and second insulating layers still in place is annealed. Thereafter a gate metallization is patterned using the previously delineated nitride for gate registration and self-alignment and finally source and drain metalizations are defined on top of the n+ implant regions on either side of the gate.

The new design uses a self-aligned approach which enables JFETs to be fabricated with gate lengths of 1.0 um or less.

In a further aspect of the design the key advantages of both ion-implantation and epitaxial growth are combined to improve the device performance. It is also possible for the self-aligned gate approach to be utilized in the fabrication of planar fully ion implanted JFETs.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein:

FIGS. 1A-1k illustrate the steps for fabricating an InP JFET of the preferred embodiment;

FIGS. 3A-3F illustrate the steps for fabricating a planar fully ion-implanted JFET.

DESCRIPTION OF THE PREFERRED EMBODIMENT

Figure 1A:
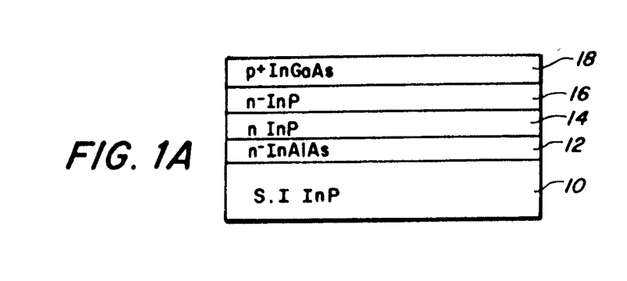

The advanced InP JFETs are fabricated by the sequence as illustrated in FIGS. 1A-1K. Initially a sample consisting of layers indicated in FIG. 1A is grown by Metal-Organic Vapor Phase Epitaxy (MOVPE). First an n. InAlAs buffer layer 12 is grown on top of a semi-insulating InP substrate 10. The semi-insulating InP substrate 10 is very thick and is low-doped to provide isolation between adjacent JFET devices on a chip that may be grown having multiple JFETs fabricated thereon. The n− InAlAs buffer layer 12 should be low doped, approximately $1 \times 10^{14}$-$1 \times 10^{15} cm^{-3}$ with a thickness of approximately 2000 Å. An n doped InP channel layer 14 is then grown on top of the buffer layer 12. The channel layer 14 is approximately 3000 Å thick and has a doping of approximately $1 \times 2$-$10^{17} cm^{-3}$. On top of the channel layer 14 is grown an n− InP etch buffer layer 16 with a thickness of approximately 2500 Å and a doping of approximately $1 \times 10^{15} cm^{-3}$. And finally, on top of the etch buffer layer 16 is grown a p+ cap layer 18 with a thickness of 2500 Å and a high doping of approximately $5 \times 10^{18} cm^{-3}$ to achieve a low ohmic contact resistance. Although the sample of FIG. 1A is grown by MOVPE, any other means of epitaxially growning the various layers may be utilized.

Figure 1B:
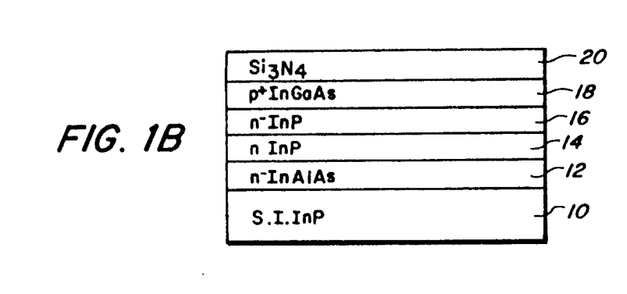
Figure 1C:
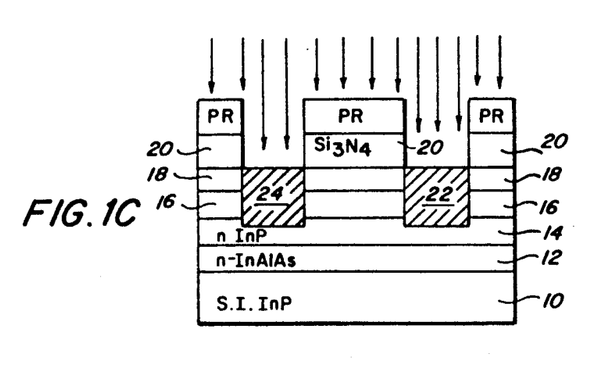
Figure 1D:
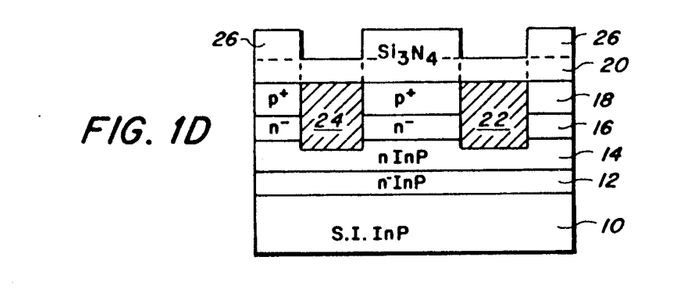
Figure 1E:
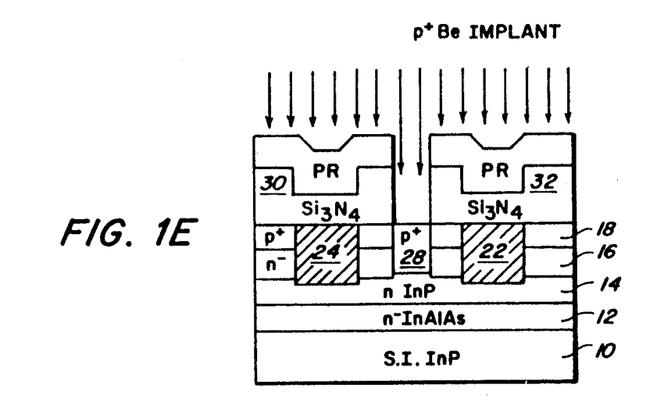

As illustrated in FIG. 1B a $Si_3N_4$ layer 20 is then grown on top of the epitaxially grown sample of FIG. 1A. Although $Si_3N_4$ is preferred, any insulator that can be patterned may be utilized instead. Using photoresist as a mask, source and drain n+ regions 22 and 24 are formed by the selective implantation of Si. Of course any other n type dopant such as Selenium may be suitable. The previously grown and patterned Si3N4 film 20 aids in the selective, chemical etch registration of the n+ implants. Upon removal of the photoresist, a second nitride layer is grown as shown in FIG. 1D. Part of this nitride layer 26 is grown on top of the first nitride layer 20 and the remaining part of this nitride layer 25 is grown on top of the implanted source and drain regions 24 and 22. A 1.0 um gate photoresist layer is then delineated as illustrated in FIG. 1E. Using photoresist as a mask, the $Si_3N_4$ is patterned by SiF4-O2 plasma etching to limit the amount of undercutting. However, any other anisotropic etch method may be appropriate including chemical or reactive ion etching. Phosphorous is then implanted followed by beryllium. However, As could be substituted for the P; and Zn or Cadmium could be substituted for the Be. The P and Be ions are implanted down to the channel layer 14 to form p+ region 28. The photoresist is again removed and the sample as shown in FIG. 1E, with its patterned nitride regions 30 and 32, still in place, is heat pulse proximity annealed at approximately 850° C. for about 15 sec.

Figure 1F:
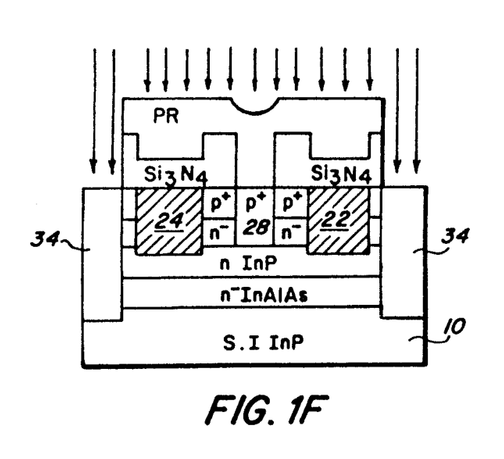
Figure 1G:
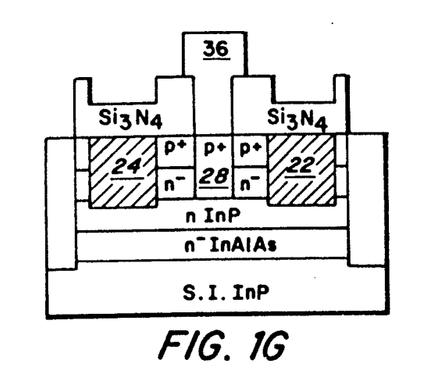
Figure 1H:
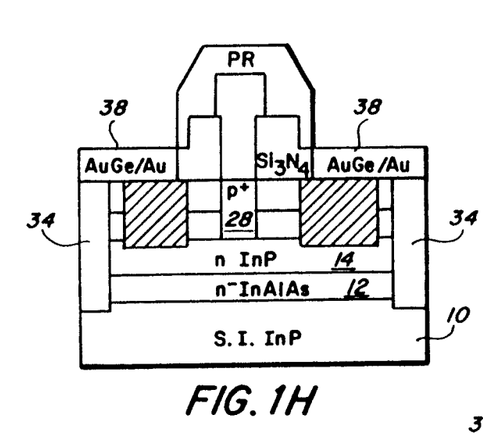
Figure 1J:
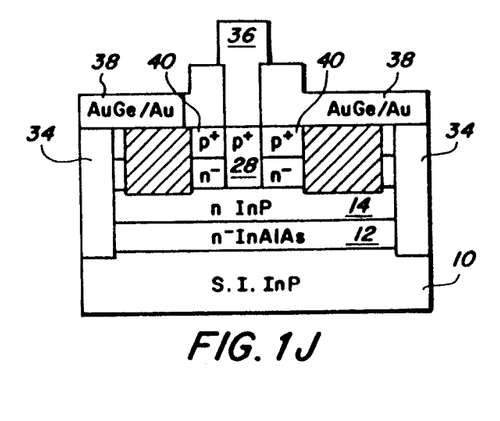
Figure 1K:
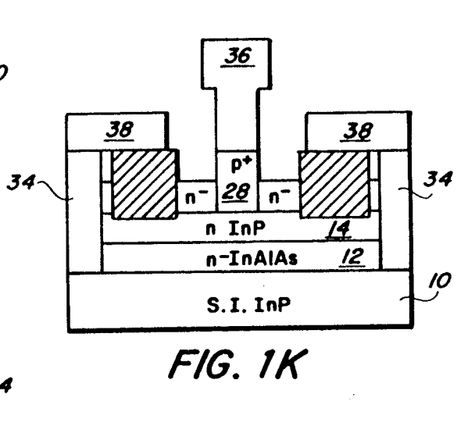

After annealing, channel isolation is performed by an oxygen damage implant using photoresist as a mask as shown in FIG. 1F. The oxygen damage implanted regions 34 extend down to the semi-insulating substrate layer 10. A 1.0 um long gate metallization 36 is then patterned by lift-off using the previously delineated nitride for gate registration and self-alignment as shown in FIG. 1G. The gate metallization 36 of the preferred embodiment is AuZn/Ni/TiW/Au. Source and drain metallizations 38 are then defined by liftoff on top of the n+ implant regions on either side of the gate as illustrated in FIG. 1H. The source and drain metallizations 38 of the preferred embodiment is AuGe/Au. The sample is hot plate alloyed at 410° C. for 1 min. to simultaneously obtain low ohmic contact resistances for both the n and p-type contact metallizations. Finally, using the gate and source-drain metallizations, 36 and 38, as a mask, the sample is then $Cl_2$ plasma-etched or chemically etched, to remove the remaining p+ InGaAs regions 40 on either side of the gate, as shown in FIG. 1K.

The key advantages of the new design are as follows:

The new JFET design employs the use of both MOVPE and selective implantation to form T-shaped p+ region (28 and 40). The horizontal portion of the region, which consists of the MOVPE grown InGaAs layer, is intended not only to extend the tolerance for gate metal alignment but also to reduce the p-type ohmic contact resistance. The vertical portion, which is formed by selective implantation, as illustrated in FIG. 1E, enables the ultimate gate length of the device to be determined by lithographic constraints rather than an etch-back technique which thus far has been found to impose stringent and conflicting demands on the fabrication process as outlined in the Background of The Invention.

The use of a T-shaped p+ region (regions 28 and 40 in FIG. 1J) makes it possible to fabricate JFETs having low ohmic contact resistance. Although in this design the excess p+ InGaAs region 40 must be removed, the etched surface is separated from the lowest portion of the p+/n junction interface where modulation of the drain current occurs. Experiments on previous JFET runs, where formation of a 1.0 um gate length required that the etching proceed to the modulation area, have indicated that etched surfaces near this interface have deleterious effects on the transconductance and gate breakdown of the device.

In this design an n− layer 16 is employed between the InGaAs p+ layer 18 and the n channel 14 to relax the etching requirements. To delineate a 1.0 μm or less gate length, it is no longer necessary to etch to the lowest part of the p/n junction interface. Once the InGaAs p+ layer 40 is removed, the gate length is determined by the Be/P implant spacing. An additional benefit is that the n− layer 16 also acts as an etch buffer since any non-uniformity of the etch profile arising from the particular wet or 24 dry etch method is also damped out providing that the n− layer 16 is thick enough (How thick?). The n− layer 16 is chosen to be lowly doped in order that the portion of the p-n junction located within the layer contributes little to the total gate capacitance. It also serves to improve the breakdown characteristics of the gate, since a portion of the breakdown will now occur in this lowly doped region.

The use of dual implantation is helpful in reducing Be-redistribution during the activation anneal. Precise control over the junction width, depth, and abruptness is of critical importance for obtaining reproducible, high transconductance JFETs. The indiffusion of the p-type dopant, which has previously been observed in both epitaxial and ion-implanted InP layers, results in a displaced, often graded p-n junction. It is well known that implanted Be is particularly susceptable to re-distribution as a result of the 700-850 activation anneal. This movement away from the as-implanted profile has been observed regardless of whether furnace or heat pulse annealing is employed. Resulting from this movement is not only a graded junction and a wider p+ spacing, but also a reduction of the p+ and n-channel carrier concentration, n-channel mobility and peak electron drift velocity. This redistribution can be minimized if the sample is pre-implanted with P or As prior to the Be. It is posutlated that a stoichiometric disturbance or bulk impurity redistribution may be the cause of the in-diffusion and that the formation of a P or As-rich surface prevents its occurrence. Using this co-implantation approach, shallow, abrupt junctions may be formed resulting in JFETs with improved transconductance. Since high transconductance and short gate lengths are essential for high freuqency performance, this new design incorporates dual implantation to minimize Be redistribution.

The power gain of microwave FETs is strongly influenced by the gate resistance. The gate resistance of a JFET is especially critical since in addition to the gate metal resistance normally present in MESFETs there also is a contribution due to the gate ohmic contact resistance. The combination of the high (0.7-0.9 eV) Schottky barrier height of metals on p-type InP, the inability to form very highly doped p-type layer, and the very small gate area employed makes it inherently difficult to make a very low resistance gate ohmic contact. For JFETs having even the lowest reported gate ohmic contact resistance values, which were measured in the low 10E-5 ohm/cm$^2$ range, the contact resistance was still found to completely dominate the total gate resistance. In these JFETs the contact resistance effect on the microwave performance was examined and the results indicated that considerable frequency response could be obtained with further contact resistance reduction.

In this design a MOVPE-grown InGaAs p+ layer 18 is employed to further reduce the gate ohmic contact resistance. At lease an order of magnitude lower contact resistance value is achievable as a result of the lower Schottky barrier height of metals to p type InGaAs (0.5-0.6 eV) and the possibility of growing very highly doped layer (1E19 cm-3) in this material. The InGaAs layer can be grown lattice matched to the p+ InP layer and forms the top horizontal portion of the T-shaped p+ region. The layer is chosen to be approximately 2500 angstroms thick to allow for p type metal contact in-diffusion as a result of the 410° C. contact alloying procedure. Due to the high doping levels achievable with p+ InGaAs, it may be possible to obtain a low enough contact resistance with simply the as-deposited metal, thus eliminating the need for the contact alloy. This would in turn elimate the need for such a thick p+ layer 18, simplifying the etch-back process considerably.

For obtaining high performance, employing an epitaxially-grown n doped channel layer 14 offers several distinct advantages over a layer formed by ion-implantation. For the same carrier concentration, an epitaxially-grown n layer usually possesses a higher mobility. Of even more significance is that the epitaxial approach offers the capability for extreme lateral precision which, when combined with the potential for heterojunction technology, is particularly useful in the engineering of the channel and its accomplished by a self-alignment technique which is made possible by patterning the thin silicon nitride film prior to implantation and using a proximity heat pulse anneal to activate the implants with the patterned nitride still in place.

ALTERNATE EMBODIMENTS

The JFET design outlined above in the preferred embodiment can be used to fabricate high electron mobility transistors (HEMTs).

Figure 2A:
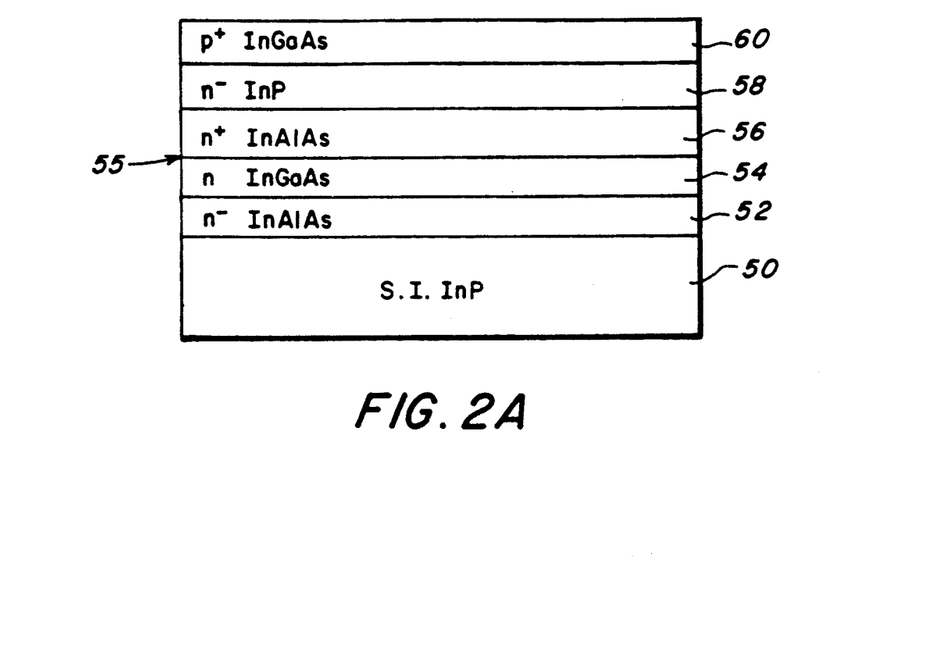
FIGS. 2A-2B illustrate the steps for fabricating an InP JHEMT.
Figure 2B:
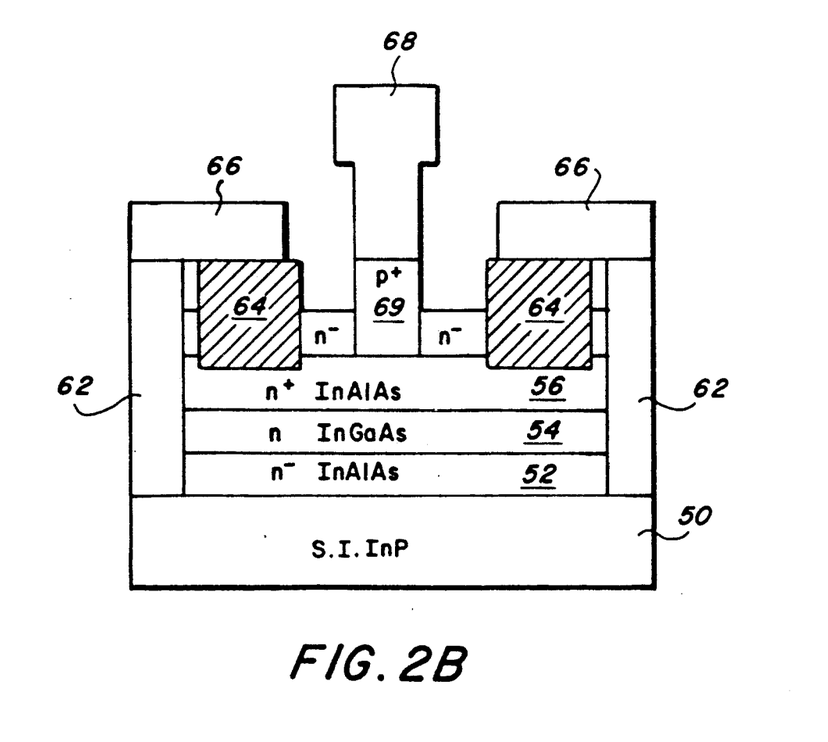

High electron mobility transistors have demonstrated improved frequency, low noise and power performance due to the improved electron transport properties within the two dimensional electron gas at the heterojunction interface and the very thin, highly doped sheet charge which can be efficiently modulated with gate voltage. As with the Schottky barrier FET, one of the major factors limiting the maximum power output in these devices is the Schottky barrier breakdown of the gate. Employment of a p-n junction rather than a Schottky gate would increase the built-in voltage and result in higher gate breakdown voltages. Analogous to GaAs JFETs, JHEMTs may also possess a higher radiation tolerance than Schottky barrier HEMTs. The fabrication design of a JHEMT is very similar to that of a JFET. Through the use of the key features outlined in the new JFET design of the preferred embodiment, a JHEMT with improved performance is obtainable. FIGS. 2A-2B illustrate such a JHEMT structure. The epitaxially sample of FIG. 2A includes an n InAlAs interface to the substrate.

It is well known that a channel layer 14 separated from the substrate 10 by an undoped buffer layer 12 can avoid the deleterious in-diffusion of substrate impurities and exhibit excellent electron mobilities and saturated drift velocities. Using an undoped buffer layer 12 of a higher band gap material has the added advantage of preventing the injection of channel electrons into the buffer layer 12 since the conduction band discontinuity at the heterointerface acts like a potential barrier for electron confinement. This is especially important for obtaining low output conductance in short gate length devices. Performance improvement has also been realized by employing a strained layer superlattice buffer layer which, in addition to confining electron, has been reported to introduce dislocation filtering and impurity gettering effects. Enhanced performance has also been reported through the use of thin, very highly doped (1E18 cm-3) n-channels. Proper engineering of the channel and its interface with the substrate is critical for obtaining optimum device performance, and the design latitude of epitaxy far exceeds that which can be obtained through ion implantation. In this design the JFETs incorporate an InAlAs/InP buffer layer interface to obtain low output conductance, though a variety of designs employing epitaxially grown layers could be explored.

The alignment of the gate metal to the 1.0 um p+ region is buffer layer 52 grown on a semi-insulating InP substrate 50. A heterojunction, including an un-doped InGaAs layer 54 and highly doped n+ InAlAs layer 56, are grown on the buffer layer 52. An n− InP etch buffer layer 58 is grown on the heterojunction layer combination and a p+ InGaAs cap layer 60 is grown on the etch buffer layer 58. Instead of starting with a single MOVPE grown n-type channel layer 14 as shown in FIG. 1A, composite layers of a wide band gap-highly doped/thin band gap-lowly doped heterojunction material system are substituted therefor to produce the necessary heterojunction interface 55. In this design the P/Be implant schedule would be designed such that the p-n junction would be located at a depth which would effectively modulate the two dimensional electron gas. The remainder of this JHEMT fabrication would be similar to that disclosed above and as shown in FIGS. 1B-1K. In FIG. 2B, there is shown the resulting JHEMT using the fabrication sequence of the preferred embodiment. The device includes damage implant regions 62, source and drain regions 64, source and drain contacts 66, and a gate contact 68 to p+ region 69.

An all-ion implanted InP JFET incorporating some of the key features of the JFET design of the preferred embodiment is also possible. The all ion-implanted approach is attractive for monolithic integration and high throughput. Planar InP JFETs can be fabricated by the same selective implants previously described with the addition of a buried Si channel implant which is performed at the start of the process run to form channel layer 72 in semi-insulating InP substrate 70 in FIG. 3A. In the fully ion implanted version, the O2 damage isolation implants and InGaAs p+ layer removal are disregarded since the selective channel implant is inherently isolated, and the p+ InGaAs layer is not present. The rest of the processing has been previously described. Though the p+ InGaAs cap layer and the epitaxially grown channel and buffer layer interface are not employed, the remaining features of the design can still be utilized. The alignment of the gate metal to the 1.0 um p+ region is accomplished by the same self-alignment technique, disclosed in the preferred embodiment, which is made possible by patterning a thin silicon nitride film prior to implantation and using a proximity heat pulse anneal to activate the implants with the patterned nitride still in place. Though not employed yet, a built-in voltage at the channel substrate interface can also be obtained by selectively implanting a buried p layer together with the normal p+ implants. Utilizing a buried p layer should result in devices with lower output conductance and thus higher power gain.

Figure 3A:
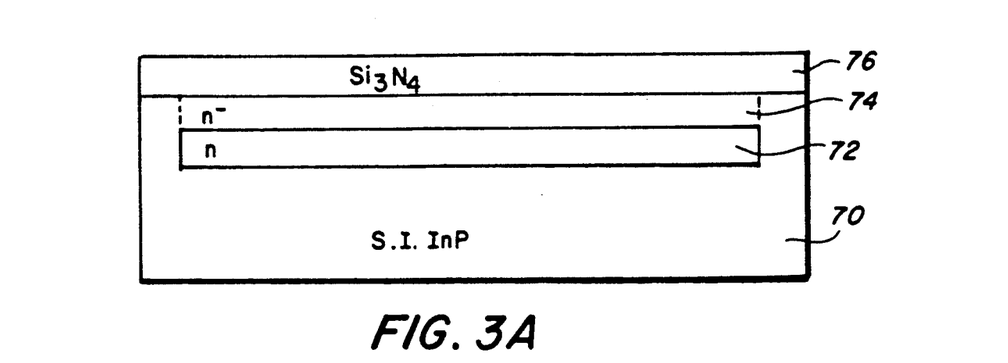
Figure 3B:
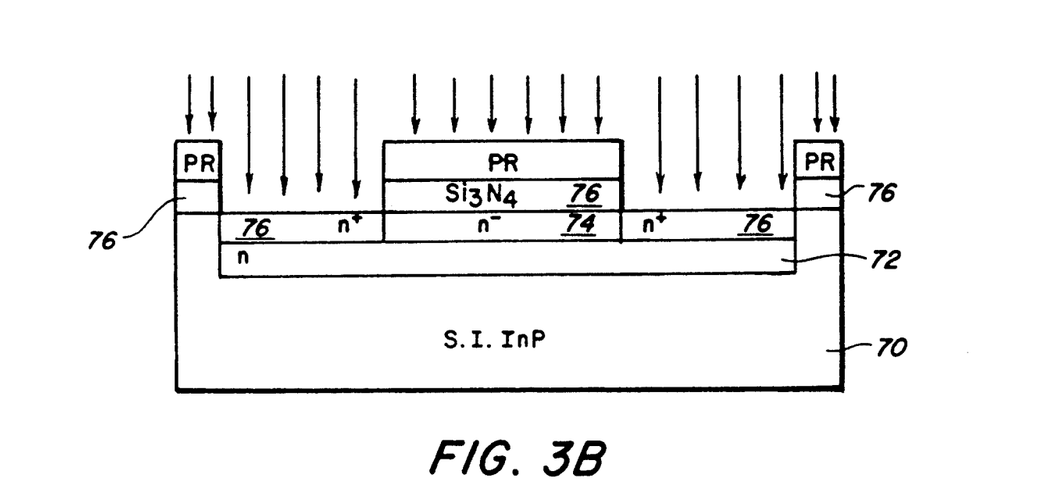
Figure 3C:
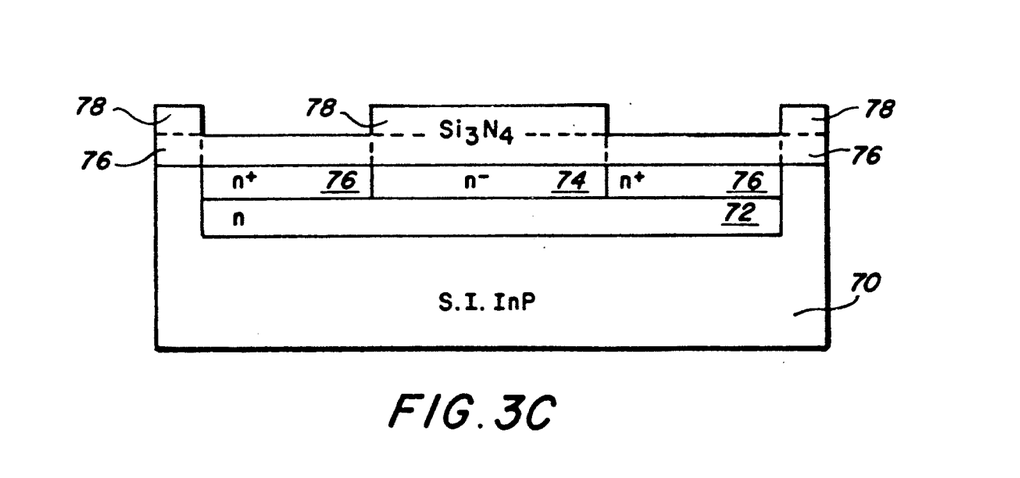
Figure 3D:
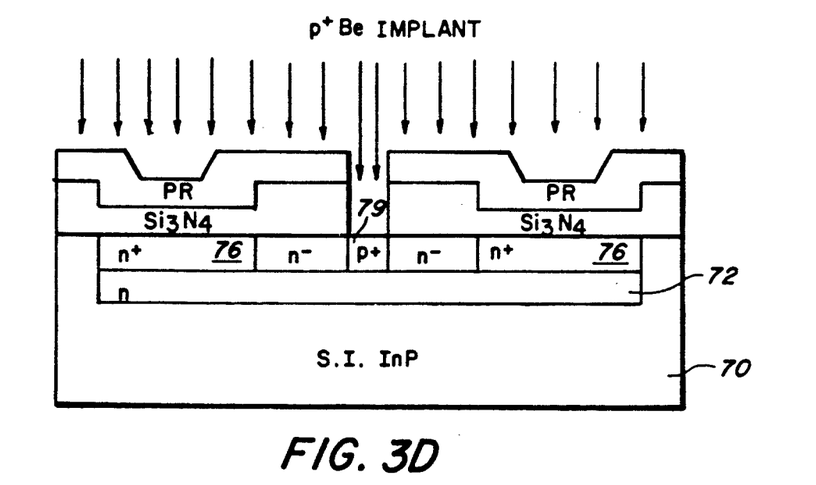
Figure 3E:
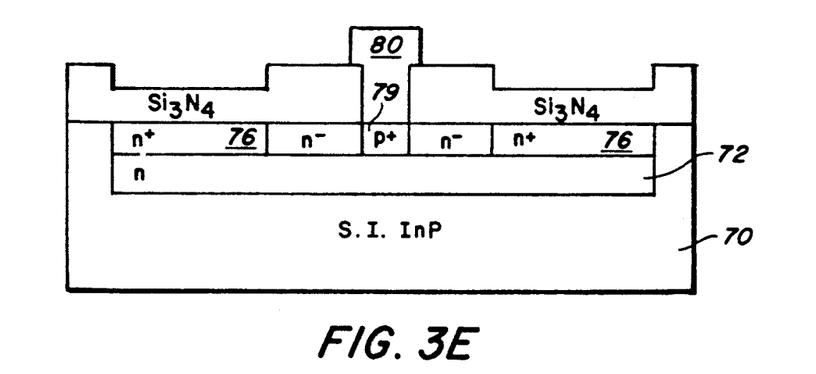
Figure 3F:
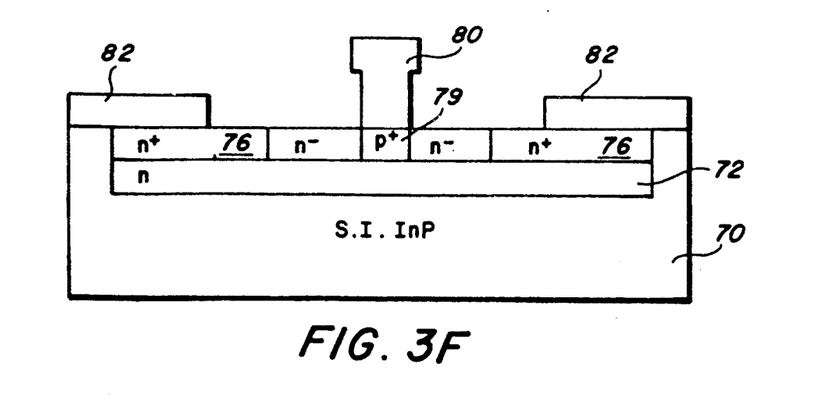

The technique for fabricating a planar, fully ion-implanted InP junction FET with a nitride-registered gate metallization is 23 shown in FIGS. 3a-3F. In FIG. 3A a channel implant is performed at the start of the process run to form channel region 72 in semi-insulating InP substrate 70. Because of the gaussian distribution of the implanted ions a low doped region 74 will result above the buried channel layer 72. A nitride layer 76 is grown on layer 74 and is patterned as shown in FIG. 3B. After Si implantation to form the n(500 keV, $1 \times 10^{13} cm^{-2}$) channel region 72 and n+(220 keV, $1 \times 10^{14} cm^{-2}$) regions 76, a second 2500 Å thick silicon nitride film 78 is grown by plasma-enhanced chemical vapor deposition at 250° C. as shown in FIG. 3C. One micrometer gate windows are then defined in photoresist and the nitride is removed in the windows by SiF4-2 percent O2 plasma etching as shown in FIG. 3D. P/Be co-implantation is then performed in the opened gate region to form p+ region 79. P(200 keV, $9 \times 10^{13} cm^2$; 110 keV, $2 \times 10^{13} cm^{-2}$) is first implanted using metal foil as a mask. The foil is then removed and Be(55 keV, $9 \times 10^{13} cm^{-2}$; 30 keV, $2 \times 10^{13} cm^{-2}$) is implanted. The sample, with its nitride still in place, is then proximity annealed at 850° C. for 15 s. In FIG. 3E, a AuZn/Ni/-TiW/Au (500 Å/150 Å/400 Å/2000 Å) gate metallization 80 is then defined by lift-off using the patterned nitride for gate registration. The Ni is included to improve the adhesion of the contact. The TiW diffusion barrier is required to maintain the conductivity of the top Au layer after alloying. AuGe/Au (1000 Å/1000 Å) source and drain metallizations 82 are then deposited on top of the n+ regions 76. Finally, the n− and p-type contacts are simultaneously hot-plate alloyed at 410° C. for 1 min in a forming-gas ambient. The nitride was then removed by plasma etching to determine its effect on JFET performance and no major differences were observed. Through the use of 1.0 um long, selective P/Be co-implantion into a buried n-type implanted channel layer, initial JFETs have been fabricated which have demonstrated a transconductance of 140 mS/mm, which is the highest value reported to date for an InP JFET. these devices represent the first one micron JFETs reported and higher performance JFETs are expected through the use of this process with sub-micron gate lithotraphy. This fully ion-implanted JFET design was described in a paper entitled "Planar, Fully Ion-Implanted InP Junction FET's with a Nitride-Registered Gate Metallization" *I.E.E.E. Elec. Dev. Let.*, Vol. 10, No. 2 Feb. 1989, by John B. Boos et al. which paper is incorporated by reference herein.

What has been described is the design and fabrication of InP JFETs and JHEMTs which utilize a nitride-registered gate approach to produce devices having sub-micron gate lengths. The process circumvents the etch-back requirements associated with previous short-gate-length designs by eliminating the need to etch to the p+/n interface. A p+ InGaAs cap layer is employed to reduce the p-type contact resistance. Measurements on a variety of test structures, which were fabricated by the fully ion-implanted approach, demonstrate the integrity of the implanted layers resulting from the proximity rapid thermal annealing with a patterned nitride present. The JFET's fabricated using a 1.0 μm gate-length implant mask exhibit a low gate leakage current, a high gate breakdown voltage, and the highest dc transconductance. Higher performance JFET's are expected through the use of this process with submicrometer gate lithography. The new JFET design of the preferred embodiment employs the use of both MOVPE and selective implantation to form a T-shaped p+ region. The horizontal portion of the region, which consists of a MOVPE-grown InGaAs layer, is intended not only to extend the tolerance for gate metal alignment but also to reduce the p-type ohmic contact resistance. The vertical portion, which is formed by selective implantation, enables the ultimate gate length of the device to be determined by lithographic constraints rather than an etch-back technique which thus far has been found to impose stringent and conflicting demands on the fabrication process.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent in the United States is:

1. A method of fabricating a sub-micron gate semiconductor device which device includes source, drain, gate regions and a channel region connecting the source and drain regions, which method comprises the steps of:
  epitaxially growing a sample with the layered sequence of a semi-insulating InP substrate, a channel region, an n− doped InP etch buffer layer and a p+ doped InGaAs cap layer;

growing a first insulating film on top of said layered sample;

patterning said first insulating film for aiding the selective, etch registration of n+ implants into said source and drain regions;

forming n+ source and drain regions by the selective implantation of an n-type dopant, while using said first insulating layer as a mask;

applying a second insulating layer on said first insulating layer;

applying a photoresist layer and delineating a gate photoresist opening above said second insulating layer;

patterning said first and second insulating layers by anisotropic etching to limit the amount of undercutting while using the photoresist layer as a mask;

sequentially implanting a first ion selected from a group consisting of P and As, followed by the implantation of a second ion selected from the group consisting of Be, Zn, and Cadmium through the gate opening into the gate region down to the channel region;

annealing the structure with said first and second insulating layers still in place;

patterning a gate metallization using said gate photoresist opening for gate registration and self-alignment;

defining source and drain metalizations on top of the n+ implant regions on either side of the gate; and removing the remaining p+ InGaAs on either side of the gate.

2. The method of fabricating a sub-micron gate semiconductor device of claim 1 wherein the channel region of said layered sample includes an epitaxially grown n-doped InP channel layer on said semi-insulating InP substrate, whereby a JFET device is produced.

3. The method of fabricating a sub-micron gate semiconductor device of claim 2 which further includes the step of alloying the resulting structure to simultaneously obtain low ohmic contact resistances for both the n and p-type contact metallizations.

4. The method of fabricating a sub-micron gate semiconductor device of claim 2 wherein an n doped InAlAs buffer layer is epitaxially grown between the semi-insulating InP substrate and the channel region of said layered sample.

5. The method of fabricating a sub-micron gate semiconductor device of claim 2 wherein said layered sample is grown by a metal-organic vapor phase epitaxy process.

6. The method of fabricating a sub-micron gate semiconductor device of claim 2 wherein the first and second insulating films are $Si_3N_4$.

7. The method of fabricating a sub-micron gate semiconductor device of claim 2 wherein the patterning of said first and second insulating layers is done by $SiF_4$-$O_2$ plasma etching.

8. The method of fabricating a sub-micron gate semiconductor device of claim 1 wherein the channel region of said layered sample includes a heterostructure including an un-doped InGaAs layer epitaxially grown on said substrate and a highly doped n+ InAlAs layer epitaxially grown on the semi-insulating substrate, whereby a JHEMT device is produced.

9. The method of fabricating a sub-micron gate semiconductor device of claim 3 which further includes the step of alloying the resulting structure to simultaneously obtain low ohmic contact resistances for both the n and p-type contact metallizations.

10. The method of fabricating a sub-micron gate semiconductor device of claim 3 wherein an $n^-$ doped InAlAs buffer layer is epitaxially grown between the semi-insulating InP substrate and the channel region of said layered sample.

11. The method of fabricating a sub-micron gate semiconductor device of claim 3 wherein said layered sample is grown by a metal-organic vapor phase epitaxy process.

12. The method of fabricating a sub-micron gate semiconductor device of claim 3 wherein the first and second insulating films are $Si_3N_4$.

13. The method of fabricating a sub-micron gate semiconductor device of claim 3 wherein the patterning of said first and second insulating layers is done by $SiF_4$-$O_2$ plasma etching.

14. A method of fabricating a sub-micron gate semiconductor device which device includes source, drain, gate regions and a channel region connecting the source and drain regions, which method comprises the steps of:

growing a first insulating layer on a semiconductor structure including a semi-insulating substrate and a channel region;

delineating source and drain regions through said first insulating layer and implanting source and drain regions into said semi-insulating substrate;

growing a second insulating layer on said first insulating layer;

applying a photoresist layer and delineating a gate photoresist opening above said second insulating layer;

patterning said first and second insulating layers by anisotropic etching to limit the amount of undercutting while using the photoresist layer as a mask;

sequentially implanting a first ion selected from a group consisting of P and As, followed by the implantation of a second ion selected from the group consisting of Be, Zn, and Cadmium through the gate opening into the gate region down to the channel region;

annealing the structure with said first and second insulating layers still in place;

patterning a gate metallization; and defining source and drain metalizations.

15. The method of fabricating a sub-micron gate semiconductor device of claim 14 which further includes the step of alloying the resulting structure to simultaneously obtain low ohmic contact resistances for all said metallizations.

* * * * *